United States Patent
Boucart et al.

(10) Patent No.: US 6,487,230 B1
(45) Date of Patent: Nov. 26, 2002

(54) VERTICAL CAVITY APPARATUS WITH TUNNEL JUNCTION

(75) Inventors: Julien Boucart, Milpitas, CA (US); Constance Chang-Hasnain, Union City, CA (US); Michael Jansen, Palo Alto, CA (US); Rashit Nabiev, Palo Alto, CA (US); Wupen Yuen, Stanford, CA (US)

(73) Assignee: Bandwidth 9, INC, Fremont, CA (US)

( * ) Notice: Subject to any disclaimer, the term of this patent is extended or adjusted under 35 U.S.C. 154(b) by 169 days.

(21) Appl. No.: 09/603,140

(22) Filed: Jun. 23, 2000

Related U.S. Application Data

(63) Continuation-in-part of application No. 09/375,338, filed on Aug. 16, 1999, now Pat. No. 6,366,597, which is a continuation of application No. 09/060,227, filed on Apr. 14, 1998, now Pat. No. 5,991,326.
(60) Provisional application No. 60/184,706, filed on Feb. 24, 2000.

(51) Int. Cl.$^7$ .............................................. H01S 5/183
(52) U.S. Cl. ........................................ 372/96; 372/45
(58) Field of Search .............................. 372/96, 45, 46, 372/58

(56) References Cited

U.S. PATENT DOCUMENTS

| | | | |
|---|---|---|---|
| 4,244,045 A | 1/1981 | Nosu et al. | 370/3 |
| 4,493,113 A | 1/1985 | Forrest et al. | 455/606 |
| 4,577,207 A | 3/1986 | Copeland | 357/17 |
| 4,577,209 A | 3/1986 | Forrest et al. | 357/30 |
| 4,595,454 A | 6/1986 | Dautremont-Smith et al. | 156/647 |
| 4,605,942 A | 8/1986 | Camlibel et al. | 357/17 |
| H147 H | 11/1986 | Feldman et al. | 357/47 |
| 4,660,208 A | 4/1987 | Johnston, Jr. et al. | 372/46 |
| 4,700,210 A | 10/1987 | Burton et al. | 357/17 |
| 4,709,413 A | 11/1987 | Forrest et al. | 455/606 |
| 4,756,590 A | 7/1988 | Forrest et al. | 350/96.15 |
| 4,768,070 A | 8/1988 | Takizawa et al. | 357/17 |
| 4,774,554 A | 9/1988 | Dentai et al. | 357/17 |
| 4,824,200 A | 4/1989 | Isono et al. | 350/96.16 |
| 4,843,280 A | 6/1989 | Lumbard et al. | 313/500 |
| 4,888,624 A | 12/1989 | Johnston, Jr. et al. | 357/16 |
| 4,949,350 A | 8/1990 | Jewell et al. | 372/45 |
| 4,991,179 A | 2/1991 | Deppe et al. | 372/45 |
| 4,999,315 A | 3/1991 | Johnston, Jr. et al. | 439/94 |
| 4,999,842 A | 3/1991 | Huang et al. | 372/45 |
| 4,999,843 A | 3/1991 | Luryi et al. | 372/45 |
| 5,005,935 A | 4/1991 | Kunikane et al. | 350/96.16 |
| 5,018,157 A | 5/1991 | Deppe et al. | 372/45 |
| 5,034,344 A | 7/1991 | Jewell et al. | 437/129 |
| 5,034,958 A | 7/1991 | Kwon et al. | 372/45 |
| 5,063,569 A | 11/1991 | Xie | 372/45 |

(List continued on next page.)

FOREIGN PATENT DOCUMENTS

| | | | | |
|---|---|---|---|---|
| EP | 0 421 674 A2 | 4/1991 | | H02S/3/096 |
| EP | 0 570 243 A1 | 11/1993 | | H01S/3/139 |
| EP | 0 818 857 A1 | 1/1998 | | H01S/1/00 |
| EP | 0 829 934 A1 | 3/1998 | | H01S/3/085 |

OTHER PUBLICATIONS

Blum, O. et al., "Electrical and optical characteristics of AIAsSb/GaAsSb distributed Bragg reflectors for surface emitting lasers"" Appl. Physics Letters, Nov. 27, 1995, vol. 67, No. 22, pp. 3233–3235.

(List continued on next page.)

Primary Examiner—James Davie
(74) Attorney, Agent, or Firm—Heller Ehrman White & McAuliffe; Paul Davis

(57) ABSTRACT

A vertical cavity apparatus includes a first mirror, a substrate and a second mirror coupled to the substrate. At least a first and a second active region are each positioned between the first and second mirrors. At least a first ion implantation layer is positioned between the first and second mirrors. At least a first tunnel junction is positioned between the first and second mirrors.

101 Claims, 13 Drawing Sheets

U.S. PATENT DOCUMENTS

| | | | |
|---|---|---|---|
| 5,068,868 A | 11/1991 | Deppe et al. | 372/45 |
| 5,073,041 A | 12/1991 | Rastani | 385/33 |
| 5,101,460 A | 3/1992 | Richard | 385/37 |
| 5,102,812 A | 4/1992 | Caneau et al. | 437/32 |
| 5,104,824 A | 4/1992 | Clausen et al. | 437/90 |
| 5,115,441 A | 5/1992 | Kopf et al. | 372/45 |
| 5,135,605 A | 8/1992 | Blonder et al. | 156/628 |
| 5,136,603 A | 8/1992 | Hasnain et al. | 372/50 |
| 5,146,078 A | 9/1992 | Luryi | 250/213 |
| 5,158,908 A | 10/1992 | Blonder et al. | 437/129 |
| 5,164,949 A | 11/1992 | Ackley et al. | 372/45 |
| 5,170,407 A | 12/1992 | Schubert et al. | 372/96 |
| 5,171,704 A | 12/1992 | Abernathy et al. | 437/81 |
| 5,182,787 A | 1/1993 | Blonder et al. | 385/131 |
| 5,206,526 A | 4/1993 | Liu et al. | 257/185 |
| 5,206,871 A | 4/1993 | Deppe et al. | 372/45 |
| 5,206,872 A | 4/1993 | Jewell et al. | 372/46 |
| 5,212,701 A | 5/1993 | Choquette et al. | 372/45 |
| 5,212,702 A | 5/1993 | Choquette | 372/45 |
| 5,212,706 A * | 5/1993 | Jain | 372/50 |
| 5,214,838 A | 6/1993 | Cho et al. | 437/105 |
| 5,216,686 A | 6/1993 | Holm et al. | 372/45 |
| 5,216,727 A | 6/1993 | Vakhshoori et al. | 385/14 |
| 5,223,723 A | 6/1993 | Luryi | 257/184 |
| 5,226,053 A | 7/1993 | Cho et al. | 372/45 |
| 5,227,006 A | 7/1993 | Abernathy et al. | 156/613 |
| 5,244,749 A | 9/1993 | Bean et al. | 428/620 |
| 5,257,648 A | 11/1993 | Woo | 257/185 |
| 5,258,316 A | 11/1993 | Ackley et al. | 437/24 |
| 5,262,360 A | 11/1993 | Holonyak, Jr. et al. | 437/237 |
| 5,281,542 A | 1/1994 | Hui et al. | 437/2 |
| 5,288,657 A | 2/1994 | Feygenson et al. | 437/90 |
| 5,291,502 A | 3/1994 | Pezeshki et al. | 372/20 |
| 5,301,201 A | 4/1994 | Dutta et al. | 372/43 |
| 5,311,526 A | 5/1994 | Gorfinkel et al. | 372/26 |
| 5,316,968 A | 5/1994 | Choquette | 437/105 |
| 5,317,587 A | 5/1994 | Ackley et al. | 372/45 |
| 5,323,416 A | 6/1994 | Bhat et al. | 372/99 |
| 5,328,854 A | 7/1994 | Vakhshoori et al. | 437/24 |
| 5,331,658 A | 7/1994 | Shieh et al. | 372/50 |
| 5,337,327 A | 8/1994 | Ackley | 372/45 |
| 5,343,490 A | 8/1994 | McCall | 372/96 |
| 5,348,912 A | 9/1994 | Choquette et al. | 437/129 |
| 5,351,257 A | 9/1994 | Lebby et al. | 372/48 |
| 5,351,261 A | 9/1994 | Lanzerotti et al. | 372/98 |
| 5,351,262 A | 9/1994 | Poguntke et al. | 372/102 |
| 5,355,385 A | 10/1994 | Amano et al. | 372/49 |
| 5,362,977 A | 11/1994 | Hunt et al. | 257/98 |
| 5,387,543 A | 2/1995 | Ackley | 437/129 |
| 5,418,183 A | 5/1995 | Joyner et al. | 437/129 |
| 5,446,752 A | 8/1995 | Ackley et al. | 372/46 |
| 5,457,760 A | 10/1995 | Mizrahi | 385/37 |
| 5,493,577 A | 2/1996 | Choquette et al. | 372/46 |
| 5,495,360 A | 2/1996 | Yoo | 359/248 |
| 5,498,883 A | 3/1996 | Lebby et al. | 257/95 |
| 5,574,744 A | 11/1996 | Gaw et al. | 372/50 |
| 5,614,436 A | 3/1997 | Shim et al. | 437/129 |
| 5,619,609 A | 4/1997 | Pan et al. | 385/136 |
| 5,629,951 A | 5/1997 | Chang-Hasnain et al. | 372/20 |
| 5,638,392 A | 6/1997 | Ramdani et al. | 372/45 |
| 5,659,640 A | 8/1997 | Joyner | 385/14 |
| 5,661,075 A | 8/1997 | Grodzinski et al. | 438/32 |
| 5,677,924 A | 10/1997 | Bestwick | 372/96 |
| 5,696,023 A | 12/1997 | Holonyak et al. | 437/133 |
| 5,719,891 A | 2/1998 | Jewell | 372/45 |
| 5,719,893 A | 2/1998 | Jiang et al. | 372/45 |
| 5,732,103 A | 3/1998 | Ramdani et al. | 372/96 |
| 5,737,104 A | 4/1998 | Lee et al. | 359/124 |
| 5,742,630 A | 4/1998 | Jiang et al. | 372/50 |
| 5,748,350 A | 5/1998 | Pan et al. | 359/130 |
| 5,751,757 A | 5/1998 | Jiang et al. | 372/50 |
| 5,757,836 A | 5/1998 | Jiang et al. | 372/50 |
| 5,760,419 A | 6/1998 | Nabiev et al. | 357/12 |
| 5,764,671 A | 6/1998 | Lebby et al. | 372/45 |
| 5,764,679 A | 6/1998 | Shen et al. | 372/69 |
| 5,805,624 A | 9/1998 | Yang et al. | 372/45 |
| 5,812,577 A | 9/1998 | Dawson et al. | 372/46 |
| 5,903,586 A | 5/1999 | Ramdani et al. | 372/45 |
| 5,960,024 A * | 9/1999 | Li et al. | 372/96 |
| 5,978,408 A | 11/1999 | Thornton | 372/96 |
| 6,222,871 B1 * | 4/2001 | Chang-Hasnain et al. | 372/96 |

OTHER PUBLICATIONS

Mikio, Y., "Circuit for Stabilizing Oscillating Wavelength of Laser Diode", Patent Abstracts of Japan, vol. 014, No. 163, Mar. 29, 1990 (JP02020084).

Ishii, H. et al., "Wavelength stabilisation of a three–electrode distributed Bragg reflector laser with longitudinal mode control", Electronics Letters, vol. 33, No. 6, Mar. 13, 1997, pp. 494–496.

Goldstein, L. et al., "Metamorphic GaAs/AIAs Bragg deposited on InP for 1,3/1,55 µm vertical cavity lasers" Centre D'Elaboration Des Materiaux et D'Etudes Structurales.

Lambert, B. et al., High Reflectivity 1.55 µm (Al) GaAsSb/AlAsSb Bragg Reactor Lattice Matched on InP Substrates; France Telecom CNET LAB/RIO; Jul. 19, 1994.

Anan, T. et al., Improved Reflectivity of AIPSb/GaPSB Bragg Reflector for 1.55 µm Wavelength; Electronics Letters; Dec. 8, 1994, vol. 30, No. 25.

Blum, O. et al., Digital Alloy AlAsSb/AlGaAsSb Distributed Bragg Reflectors Lattice Matched to InP For 1.3–1.55 µm Wavelength Range; Electronics Letters; Jul. 20, 1995, vol. 31, No. 15.

* cited by examiner

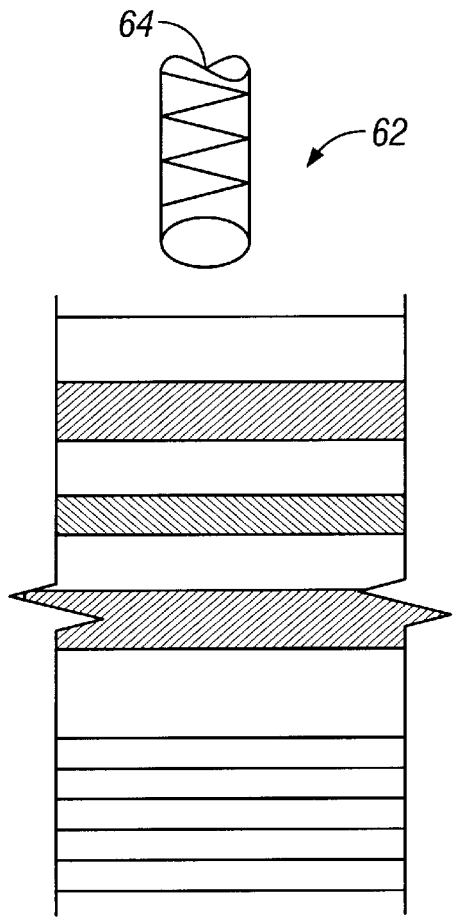
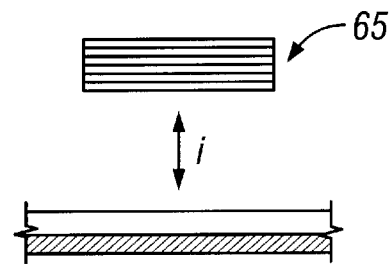
FIG. 20
FIG. 19
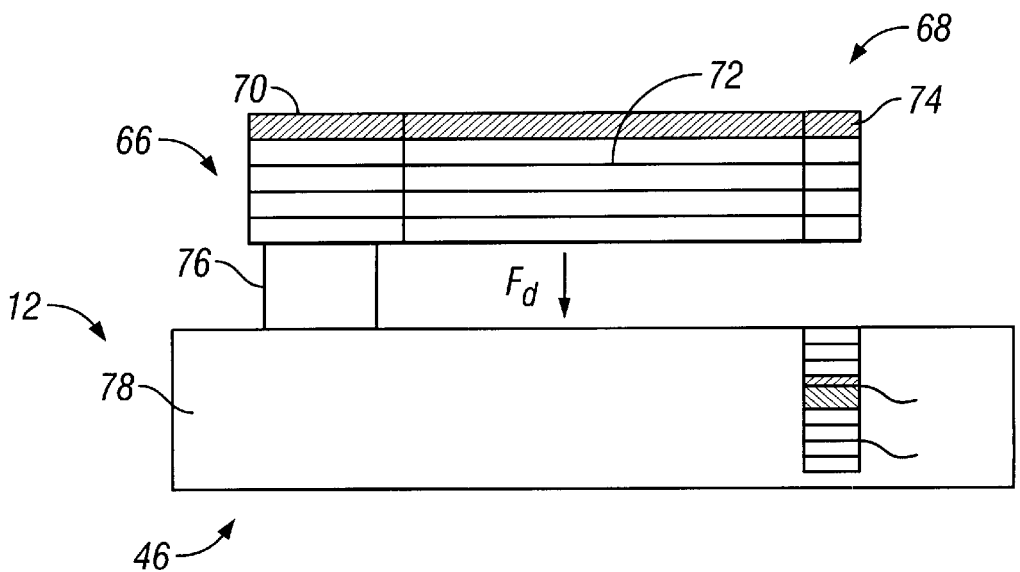
FIG. 21

VERTICAL CAVITY APPARATUS WITH TUNNEL JUNCTION

CROSS-REFERENCE TO RELATED APPLICATIONS

This application is a continuation-in-part of Ser. No. 09/375,338, filed Aug. 16, 1999, now U.S. Pat. No. 6,360,597 which is a continuation of Ser. No. 09/060,227 filed Apr. 14, 1998 (now U.S. Pat. No. 5,991,326). This application is also a continuation-in-part and claims the benefit of the priority date of Provisional Application Ser. No. 60/184,706, filed Feb. 24, 2000, all of which applications are fully incorporated by reference herein.

BACKGROUND OF THE INVENTION

1. Field of the Invention

This invention relates generally to a vertical cavity apparatus, and more particularly to a vertical cavity apparatus with at least one tunnel junction.

2. Description of Related Art

Continued advances in long-distance, fiber-optic communications depend on high-quality laser sources. Since optical fibers exhibit lowest attenuation and dispersion at the wavelengths of 1.3 $\mu$m and 1.55 $\mu$m, suitable sources should emit at these relatively long wavelengths in single-mode operation.

Traditionally, long-wavelength distributed feedback (DFB) lasers are employed in fiber-optic communications systems for their single longitudinal and transverse mode characteristics. However, fabricating DFB lasers involves very complicated and low-yield processes. Furthermore, the DFB laser performance is very sensitive to the surrounding temperature change. Thus, complicated electronics are needed in the transmitter to control the operating environment. These disadvantages render the DFB laser a very expensive light source and severely limit its application in the fiber-optic communications field.

Vertical Cavity Surface Emitting Lasers (VCSELs) emitting in the 1.3 $\mu$m and 1.55 $\mu$m ranges have been visualized as promising candidates for replacing DFBs in telecommunications applications. Due to their extremely short cavity length (on the order of one lasing wavelength), VCSELs are intrinsically single longitudinal mode devices. This eliminates the need for complicated processing steps that are required for fabricating DFB lasers. Furthermore, VCSELs have the advantage of wafer-scale fabrication and testing due to their surface-normal topology.

Unfortunately, VCSELs suffer material limitations that are negligible in the case of short-wavelength VCSELs but drastically affect the performance of long-wavelength VCSELs. The small available refractive index difference $\Delta n$ between reflective layers of the Distributed Bragg Reflectors (DBRs) requires that a large number of layers with high composition and thickness precision be used to achieve sufficient reflectivity. Another object of the present invention is to reduce loss in a vertical cavity apparatus. Due to the small $\Delta n$ the relatively thick DBR's result in high diffraction losses. Furthermore, high free-carrier absorption loss limits the maximum achievable reflectivity and the high non-radiative recombination rate increases the electrical current for reaching the lasing threshold.

These problems have restricted prior art fabrication efforts to non-wafer-scale, complicated and low-yield processes such as wafer fusion described by D. I. Babic et al., "Room-Temperature Continuous-Wave Operation of 1.54 $\mu$m Vertical-Cavity-Lasers", IEEE Photonics Technology Letters, Vol. 7, No. 11, 1995, pp. 1225–1227 and Y. Oshiso et al., "1.55 $\mu$m Vertical-Cavity Surface-Emitting Lasers with Wafer-Fused InGaAsP/InP-GaAs/AlAs DBRs", Electronics Letters, Vol. 32, No. 16, 1996, pp. 1483–1484. Alternatively, long-wavelength VCSELs have also been manufactured by evaporation of dielectric mirrors as described by S. Uchiyama et al., "Low Threshold Room Temperature Continuous Wave Operation of 1.3 $\mu$m. GaInAsP/InP Strained Layer Multiquantum Well Surface Emitting Laser", Electronics Letters, Vol. 32, No. 11, 1996 pp. 1011–13; M. A. Fisher et al., "Pulsed Electrical Operation of 1.5 $\mu$m Vertical-Cavity-Surface-Emitting Lasers", IEEE Photonics Technology Letters, Vol. 7, No. 6, 1995, pp. 608–610 and T. Tadokoro et al., "Room Temperature Pulsed Operation of 1.5 $\mu$m GaInAsP/InP Vertical-Cavity Surface-Emitting Lasers", IEEE Photonics Technology Letters, Vol. 4, No. 5, 1992, pp. 409–411.

Unfortunately, these methods do not allow one to efficiently grow long-wavelength VCSELs.

Tunneling in GaAs, at an n+/p+ junction, is well known (see, for example, N. Holonyak, Jr. and I. A. Lesk, Proc. IRE 48, 1405, 1960), and is generally of interest for its negative resistance. Tunneling in GaAs can be enhanced with an InGaAs transition region (see, for example, T. A. Richard, E. I. Chen, A. R. Sugg. G. E. Hofler, and N. Holonyak, Jr., Appl. Phys. Lett. 63, 3613, 1993), and besides its negative resistance behavior, can be used in reverse bias as a form of "ohmic" contact. This allows, for example, the reversal of the doping sequence of an Al sub x Ga sub 1-x As-GaAs quantum well heterostructure laser (n forward arrow p to p forward arrow n) grown on an n-type GaAs substrate. See, for example, A. R. Sugg, E. I. Chen, T. A. Richard, S. A. Maranowski, and N. Holonyak, Jr., Appl. Phys. Lett. 62, 2510 (1993) or the cascading of absorbing regions to produce higher efficiency solar cells (see for example D. L. Miller, S. W. Zehr and J. S. Harris Jr. Journ. App. Phys., 53(1), pp. 744—748, (1982) and P. Basmaji, M. Guittard, A. Rudra, J. F. Carlin and P. Gibart, Journ. Appl., Phys., 62(5), pp 2103–2106, (1987)).

Use of tunnel junctions in order to increase the optical round-trip gain in the cavity and increase differential efficiency is shown in "Room-temperature, electrically-pumped, multiple-active region VCSELs with high differential efficiency at 1.55 $\mu$m", Kim, J. K.; Hall, E.; Sjolund, O.; Coldren, L. A.; Dept. Electr. & Comput. Eng., California Univ., Santa Barbara, Calif., 1999 IEEE LEOS Annual Meeting Conference Proceedings, 12th Annual Meeting San Francisco, Calif., Nov. 8–11, 1999 and in "CW room temperature operation of a diode cascade quantum well VCSEL", Knodl, T.; Jager, R.; Grabherr, M.; King, R.; Kicherer, M.; Miller, M.; Mederer, F.; Ebeling, K. J.; Dept. of Optoelectron., Ulm Univ., Germany, 1999 IEEE LEOS Annula Meeting Conference Proceedings, 12th Annual Meeting San Francisco, Calif., Nov. 8–1 1999. The concept has also been demonstrated in edge emitting laser where several active layers have been stacked to produce high power lasers (see for example J. C. Garcia, E. Rosencher, P. Collot, N. Laurent, J. L. Guyaux, E. Chirlias and J. Nagle, PT1.15 Xth international MBE conference on Molecular Beam Epitaxy, Cannes (France), 1998; U.S. Pat. No. 5,212,706, Issued May 18, 1993, "Laser diode assembly with tunnel junctions and providing multiple beams", J. Faquir, C. Storrs.

A tunnel contact junction can be used in a light emitting semiconductor device as a hole source and makes possible lateral bias currents (electron current) to drive a quantum well heterostructure (QWH) laser without the compromise of the low mobility and large resistive voltage drop of lateral conduction in thin p-type layers. This is particularly valuable in QWH laser structures employing upper and/or lower native oxide confining layers (see, for example, M. Dallesasse, N. Holonyak Jr., A. R. Sugg, T. A. Richard, and N. El Zein, Appl. Phys. Lett 57 2844, 1990; A. R. Sugg, E. I. Chen, T. A. Richard, N. Holonyak Jr., and K. C. Hsieh, Appl. Phys. Lett 62, 1259, 1993; U.S. Pat. No. 5,936,266. N. Holonyak, J. J. Wierer, P. W. Evans) that require lateral bias currents (see, for example, P. W. Evans, N. Holonyak, Jr., S. A. Maranowski, M. J. Ries, and E. I. Chen, Appl. Phys. Lett. 67, 3168, 1995), or in devices such as a vertical cavity surface emitting laser (VCSEL) where lateral hole currents have been employed (see, for example, D. L. Huffker, D. G. Deppe, and K. Kumar, Appl. Phys. Lett. 65, 97, 1994). Hole conduction along a layer introduces a large device series resistance, because of the low hole mobility, and increases threshold voltages and device heating. A tunnel contact junction on the p side of an oxide confined QWH can be used to replace lateral hole excitation currents. The hole injection is supported by a lateral electron current, thus providing lower voltage drop and less series resistance. This minimizes the amount of p-type material and, to the extent possible, employ only n-type layers (electron conduction) to carry the device current. In addition to electrical and thermal performance advantages from reducing the amount of lossier p-type material, an optical advantage can also accrue since p-type material of the same conductance as n-type material is generally more absorptive of the light being generated in semiconductor light emitting devices (see for example J. Boucart, C. Starck, F. Gaborit, A. Plais, N. Bouche, E. Derouin, L. Goldstein, C. Fortin, D. Carpentier, P. Salet, F. Brillouet, and J. Jacquet, Photon Tech. Lett., 11(6), June 1999 and Patent EP00869593A. F. Brillouet, P. Salet, L. Goldstein, P. Garabedian, C. Starck, J. Boucart/ JP10321952A).

There is a need for a vertical cavity apparatus with improved gain. There is a further need for an improved vertical cavity apparatus with higher power. There is another need for an improved vertical cavity apparatus with high efficiency. There is a further need for an improved vertical cavity apparatus with high sensitivity. A further need exists for an improved vertical cavity apparatus with tunnel junctions. Yet another need exists for an improved vertical cavity apparatus that cascades multiple pn junctions with a single power source.

SUMMARY

Accordingly, an object of the present invention is to provide a vertical cavity apparatus with improved gain.

Another object of the present invention is to reduce loss in a vertical cavity apparatus.

Yet another object of the present invention is to provide a vertical cavity apparatus with high efficiency.

A further object of the present invention is to provide a vertical cavity apparatus with high sensitivity.

Yet another object of the present invention is to reduce resistance in a vertical cavity apparatus.

Another object of the present invention is to prevent current spreading in a vertical cavity apparatus.

A further object of the present invention is to provide a vertical cavity apparatus with tunnel junctions.

Another object of the present invention is to provide a vertical cavity apparatus that cascades multiple pn junctions with a single power source.

Yet another object of the present invention is to provide a high power VCSEL.

Still a further object of the present invention is to provide a low threshold VCSEL.

Another object of the present invention is to provide a VCSEL with a large tuning range.

A further object of the present invention is to provide a VCSEL with tunnel junctions.

Another object of the present invention is to provide a VCSEL that cascades multiple pn junctions with a single power source.

These and other objects of the present invention are achieved in a vertical cavity apparatus that includes a first mirror, a substrate and a second mirror coupled to the substrate. At least a first and a second active region are each positioned between the first and second mirrors. At least a first ion implantation layer is positioned between the first and second mirrors. At least a first tunnel junction is positioned between the first and second mirrors.

BRIEF DESCRIPTION OF THE DRAWINGS

FIG. 1(*b*) is a cross-sectional view of a VCSEL structure of the present invention with a tunnel junction positioned between the top and bottom mirrors and an oxide layer positioned adjacent to the bottom mirror.

FIG. 1(*c*) is a cross-sectional view of the VCSEL structure of FIG. 1(*a*) with a second tunnel positioned between the top and bottom mirrors.

FIG. 19 is a cross-sectional view of a vertical cavity structure of the present invention with a fiber grating.

FIG. 20 is a cross-sectional view of a top mirror used with the present invention that is a fused mirror.

FIG. 21 is a cross-sectional view of a top mirror used with the present invention that is a cantilever structure.

DETAILED DESCRIPTION OF THE PREFERRED EMBODIMENTS

The present invention is a vertical cavity apparatus with a first mirror, a substrate and a second mirror grown on the substrate. The vertical cavity structure of the present invention can be a vertical cavity surface emitting laser, a vertical cavity detector, a vertical cavity modulator, a vertical cavity attenuator, a vertical cavity amplifier, a vertical cavity micromechanical structure, a vertical cavity micromechanical structure with a single support member, a vertical cavity micromechanical structure with at least two support members or a vertical cavity tunable micromechanical structure.

Figure 1A:
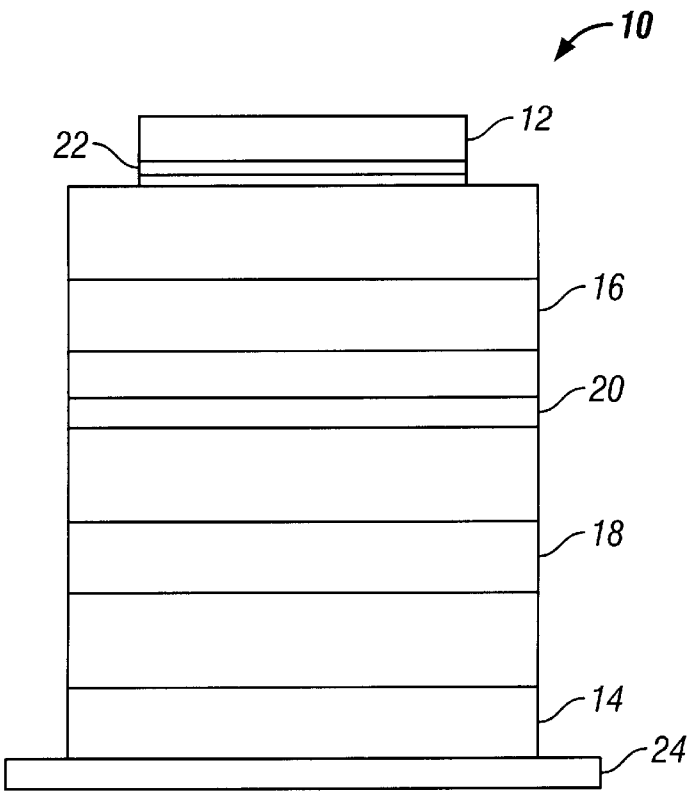
FIG. 1(*a*) is a cross-sectional view of a VCSEL structure of the present invention with two active layers, a tunnel junction positioned between the top and bottom mirrors and an oxide layer positioned between the top mirror and the top active layer.
Figure 1B:
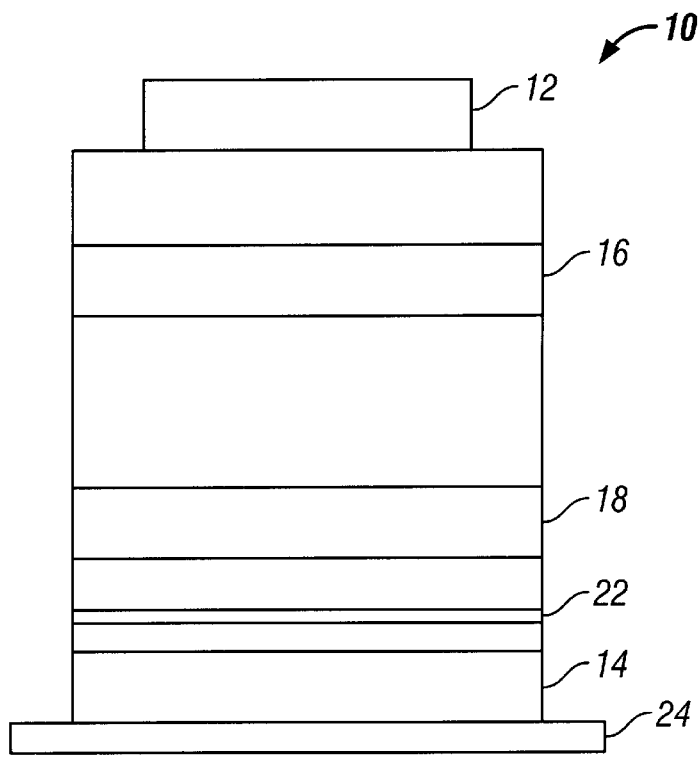

In one embodiment, illustrated in FIGS. 1(a) and 1(b), the vertical cavity structure is a VCSEL 10. VCSEL 10 is a layered structure with top and bottom mirrors 12 and 14. Light is emitted in a vertical direction that is perpendicular to the planes of the layers. Top and bottom mirrors 12 and 14 are preferably DBR's. The use of DBR's allows to obtain very high reflectivities (>99.5%).

First and second active layers 16 and 18 are positioned between top and bottom mirrors 12 and 14. Examples of suitable materials for first and second active layers 16 and 18 include but are not limited to InGaAsP, InAlGaAs, InGaAs and the like. At least one tunnel junction 20 and a first oxide layer 22 are each positioned between top and bottom mirrors 12 and 14. Tunnel junction 22 can have a width in the range of 5 nm–500 nm. Oxide layer 22 can a thickness of less than 0.5 μm. Also included is a substrate 24. Substrate 24 can be made of a variety of materials including but not limited to InP, GaAs and the like. In FIG. 1(a), first oxide layer 22 is positioned between top mirror 12 and first active layer 16. In FIG. 1(b), first oxide layer 22 is positioned between bottom mirror 14 and second active layer 18. Oxide layer 22 is located in a p type material. There are two main advantages depending on the position of tunnel junction 20. When positioned between two active regions tunnel junction 20 increases the gain. When positioned on top of an active region tunnel junction 20 allows low intracavity access resistance and use of low loss mirrors by either using n-doped DBR (for vertical injection) or undoped DBR (intracavity contact) which have less free carrier losses than p-type DBRs.

Top mirror 12 can be partially oxidized. Oxidation of top mirror 12 creates a large refractive index difference between adjacent layers. This index difference can drastically increase the stop bandwidth of top mirror 12, and therefore relax the growth accuracy for top mirror 12. The high-contrast, oxidized top mirror 12 reduces the diffraction loss and eliminates the free-carrier-absorption loss.

When top mirror 12 is oxidized, the thickness of high Al-content layers is calculated by taking into account the refractive index and thickness change resulted from the oxidation process. The oxidized part of top mirror 12 is undoped to eliminate free-carrier absorption loss. Oxidation of top mirror 12 can be done in conjunction with the oxidation of the confinement layer. The oxidation process can be conducted in a water-saturated nitrogen ambient, at a temperature between 350° C. to 450° C.

Top and bottom mirrors 12 and 14, as well as the active regions can be grown in the same epitaxial process. This procedure allows full-wafer growth and processing, and therefore significantly reduces the cost of fabricating long-wavelength VCSELs. The lattice relaxed portion of VCSEL 10 can also be grown by a separate epitaxial growth process. When using the molecular beam epitaxy method, the growth temperature for top mirror 12 is preferably less than 500° C. The lattice relaxed mirror can incorporate a tunnel junction. At least one layer of VCSEL 10 can be grown while the substrate 24 is held stationary and the other layers are grown while substrate 24 is rotated.

Figure 1C:
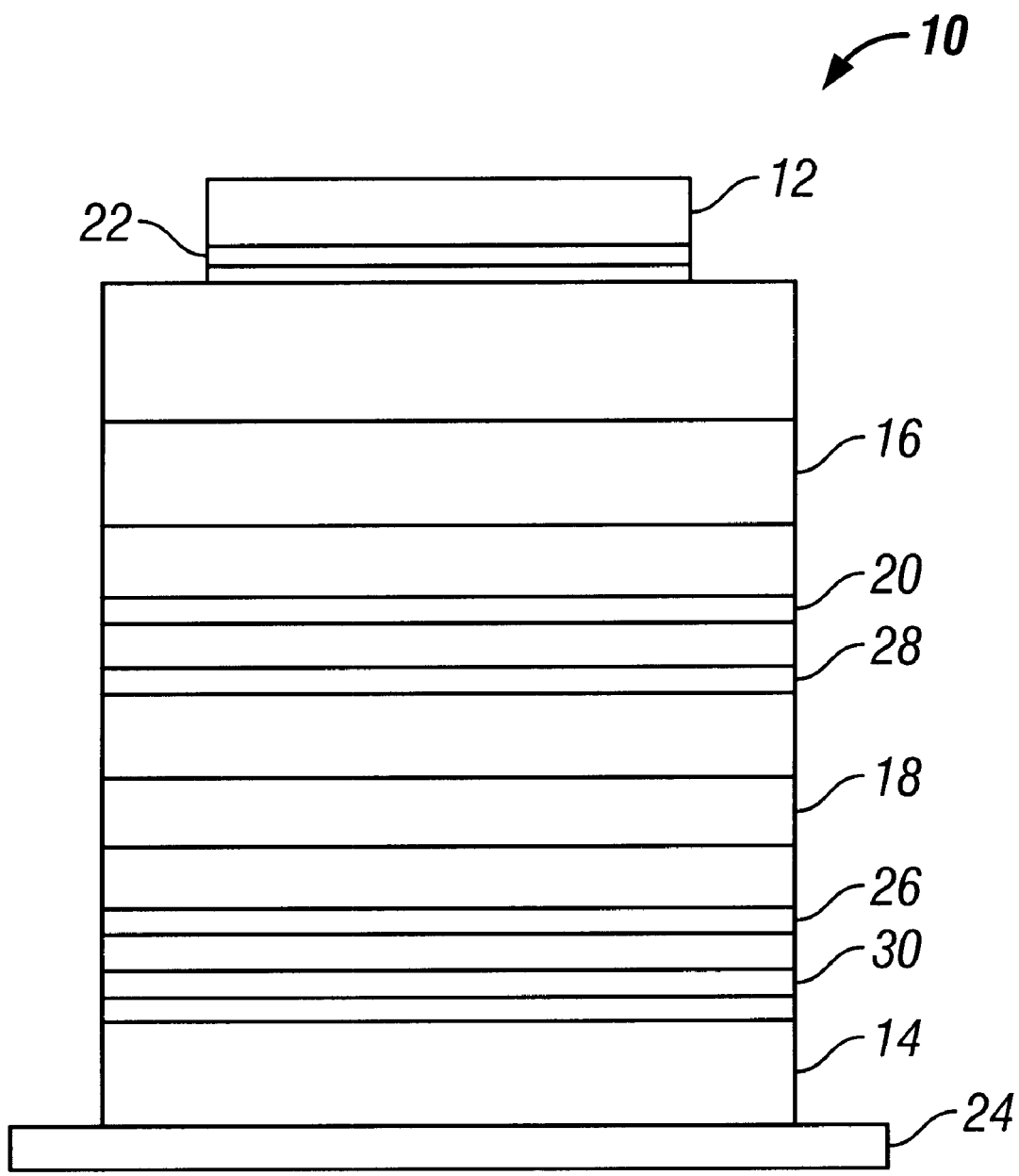

Referring now to FIG. 1(c), a second tunnel junction 26 can be optionally included and positioned between bottom mirror 14 and second active layer 18. Additional tunnel junctions increase the gain. A first partial DBR 28 can also be included and positioned between first and second active regions 16 and 18.

Figure 2:
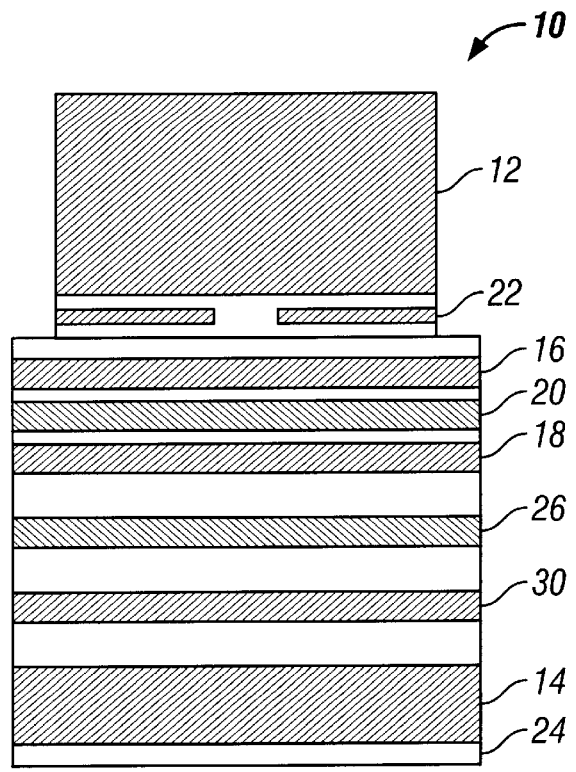
FIG. 2 is a cross-sectional view of the VCSEL structure of FIG. 1(*a*) with three active layers, two tunnel junctions and an oxide layer positioned between the top mirror and the top active layer.

FIG. 2 illustrates an embodiment of VCSEL 10 with a third active region 30. First and second tunnel junctions 20 and 26 are positioned between first, second and third active regions 16, 18 and 30 respectively. Although the first oxide layer 22 is shown as being positioned adjacent to top mirror 12, it will be appreciated that another oxide layer 22 can alternatively be positioned between active layers. Additional active layers can be included. Preferably, no more than ten active layers are included. More preferably the number of active layers is five or less or no more than three.

Figure 3:
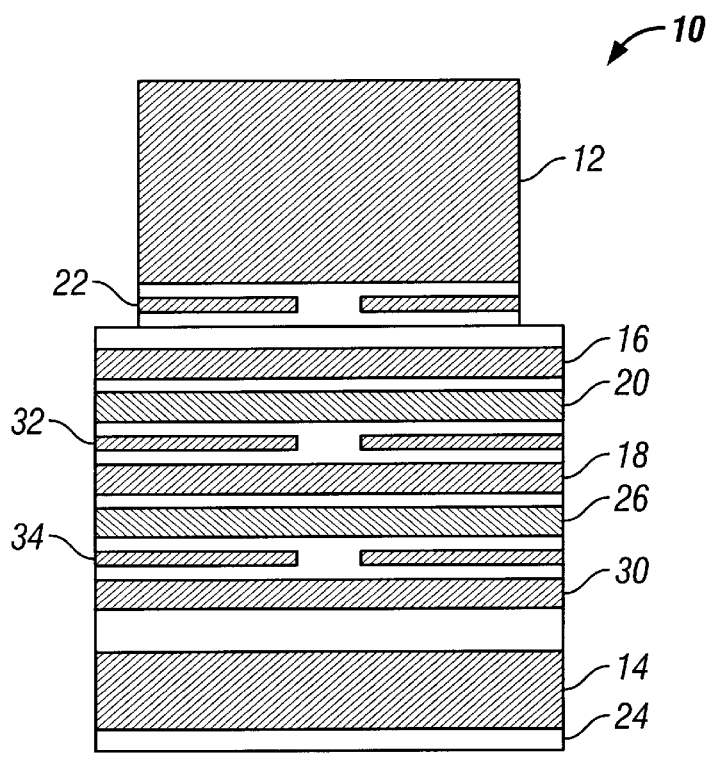
FIG. 3 is a cross-sectional view of the VCSEL structure of FIG. 2 with two additional oxide layers, each positioned between a tunnel junction and an active layer.

Additional oxide layers can be included. FIG. 3 the inclusion of second and a third oxide layers 32 and 34 are used to reduce current spread. Oxide layers 32 and 34 become insulators and force the current to be funneled in the semiconductor layer (at the center) that is not oxidized. In the embodiment illustrated in FIG. 3, second oxide layer 32 is positioned between first tunnel junction 20 and second active layer 18, and third oxide layer 34 is positioned between second junction 26 and third active region 30. This specific arrangement reduces the current spreading between active layers.

Figure 4:
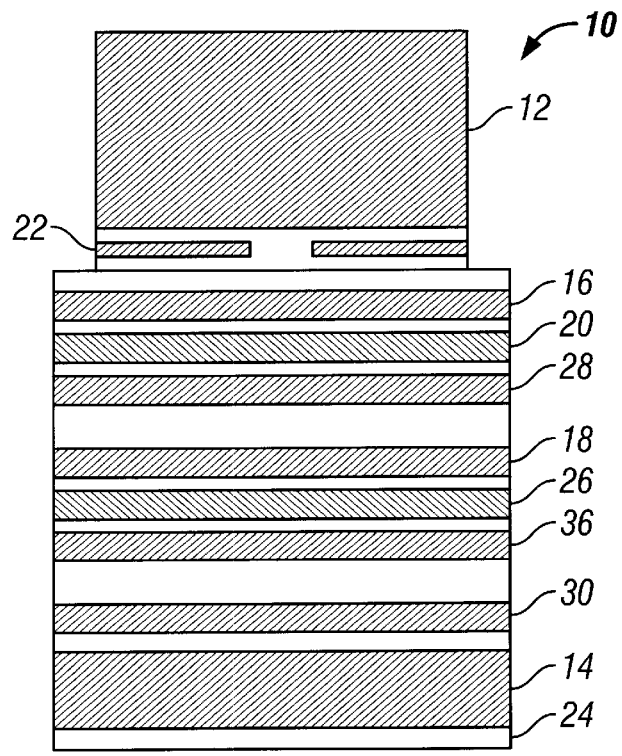
FIG. 4 is a cross-sectional view of the VCSEL structure of FIG. 2 two partial DBR's, each positioned between a tunnel junction and an active layer.

As shown in FIG. 4, multiple partial DBR's can be included and positioned between top and bottom mirrors 12 and 14. First and second partial DBR's 28 and 36 form several FB cavities with different FP wavelengths in order to stabilize the performance in temperature and the wavelength range of tuning. In FIG. 4, first partial DBR 28 is positioned between first and second active regions 16 and 18. Second partial DBR 36 is positioned between second and third active regions 18 and 30. In the embodiment illustrated in FIG. 4, first tunnel junction 20 is positioned first active region 16 and first partial DBR 28. Second tunnel junction 26 is positioned between second active region 18 and second partial DBR 36.

Figure 5:
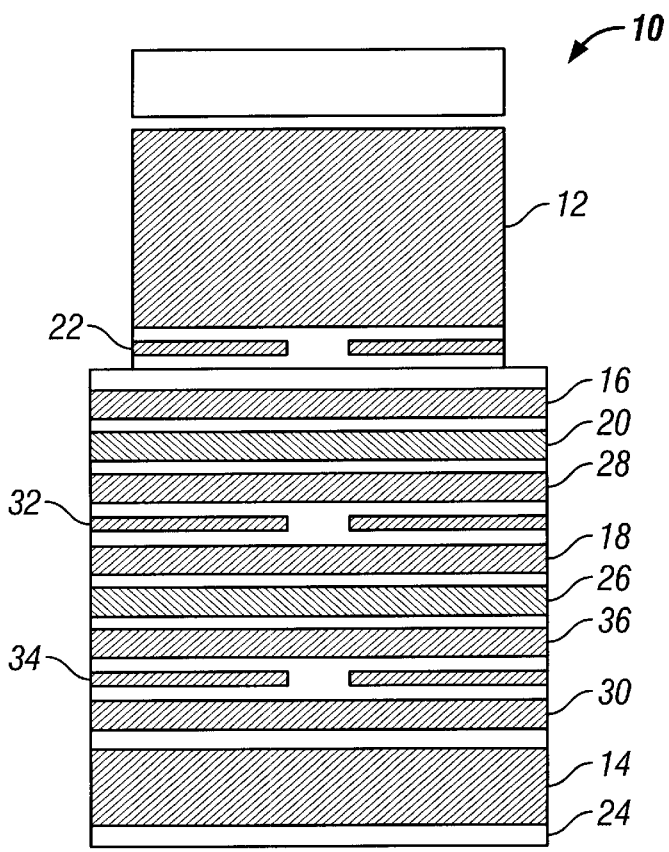
FIG. 5 is a cross-sectional view of the VCSEL structure of FIG. 4 with two additional oxide layers, each positioned between a tunnel junction and an active layer.

As illustrated in FIG. 5, the VCSEL 10 from FIG. 4 can also include second and third oxide layers 32 and 34 that are positioned between the first and second partial DBR's 28 and 36 and active regions 18 and 30.

Figure 6:
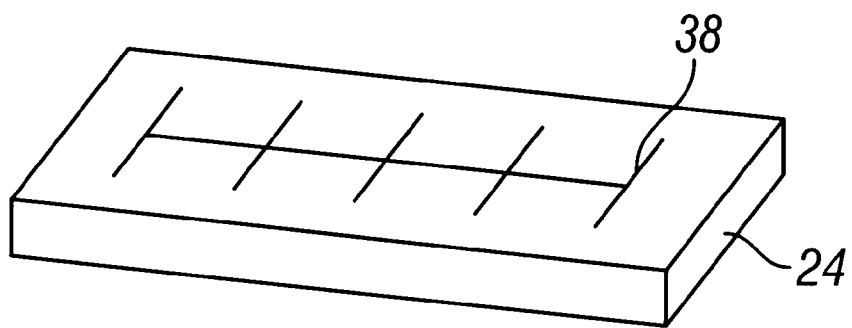
FIG. 6 is a perspective view of the substrate from the FIG. 1(*a*) through FIG. 5 VCSELS with an etched pattern formed on a top or bottom surface.
Figure 7:
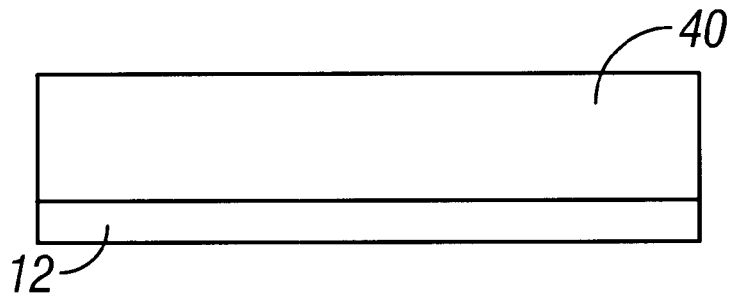
FIG. 7 is a cross-sectional view of a top mirror used with the present invention that includes a metallic layer.
Figure 7:
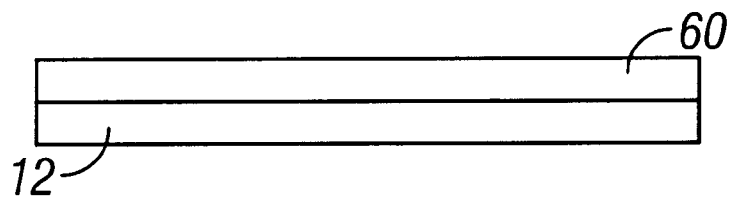

Substrate 24 has a given crystallographic orientation. Examples of suitable crystallographic orientations include but are not limited to (001), (311A), (311B) and (110). As illustrated in FIG. 6, substrate 24 can have an etched pattern 38 formed on a top or bottom surface, where the top surface is adjacent to bottom mirror 14. Substrate 24 can include a dielectric pattern. All or a portion of the substrate 24 layers can be grown using selective area epitaxy.

Figure 8:
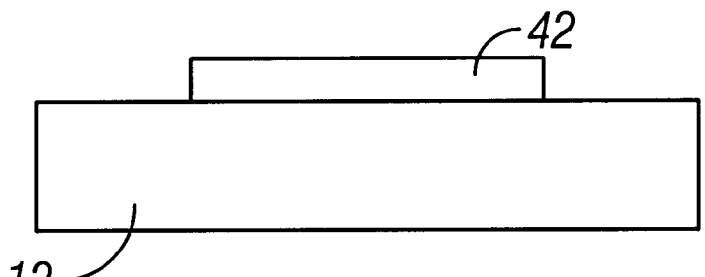
FIG. 8 is a cross-sectional view of a top mirror used with the present invention that is coupled to a tunable filter.

Top mirror 12 can be tunable. A metallic layer 40 can be positioned on the top of top mirror 12. Metallic layer 40 boosts the reflectivity of the DBR. Top mirror 12 can be integrated with a tunable filter 42 (FIG. 8).

Figure 9:
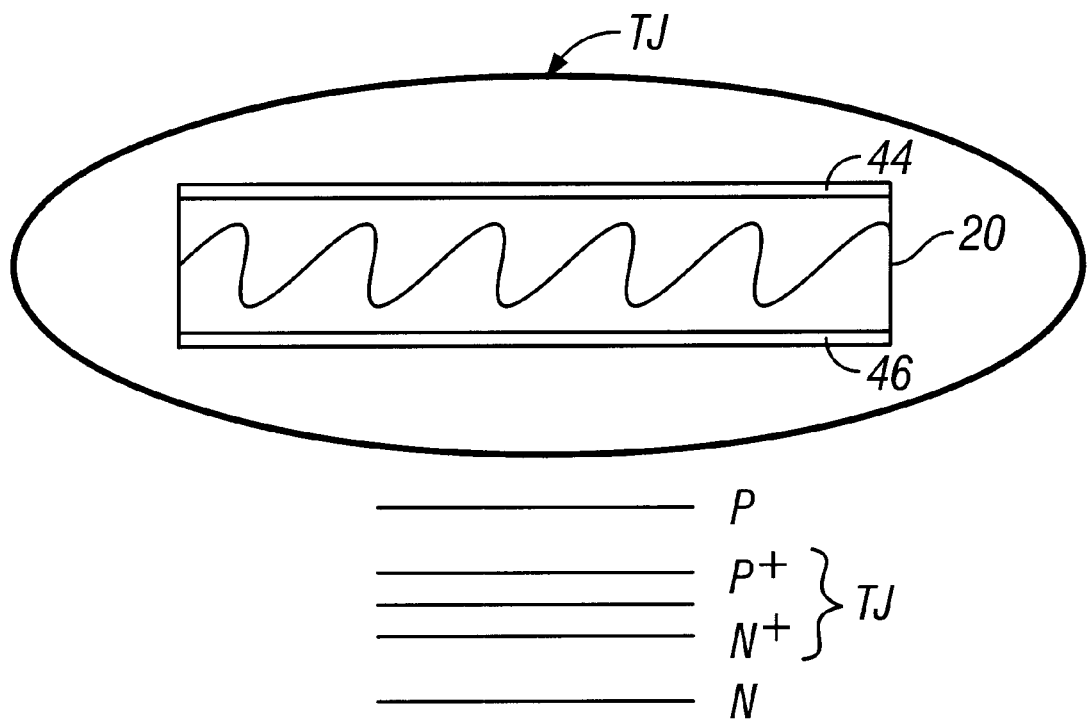
FIG. 9 is a cross-sectional view of a tunnel junction used with the present invention, illustrating the tunnel junction's opposing first and second sides.

Referring now to FIG. 9, tunnel junctions 20 and 26 have first and second opposing sides 44 and 46 which are cladding regions. Cladding regions 44 and 46 can be made of the same material, different materials, have different thickness and have different doping profiles and can be non doped. Tunnel junctions 20 and 26 can be uniformly doped and non-uniformly doped. Tunnel junctions 20 and 26 are doped with opposite dopants (i.e., n-type/p-type). Additionally, tunnel junctions 20 and 26 and cladding regions 44 and 46 can be compositionally graded.

Figure 10:
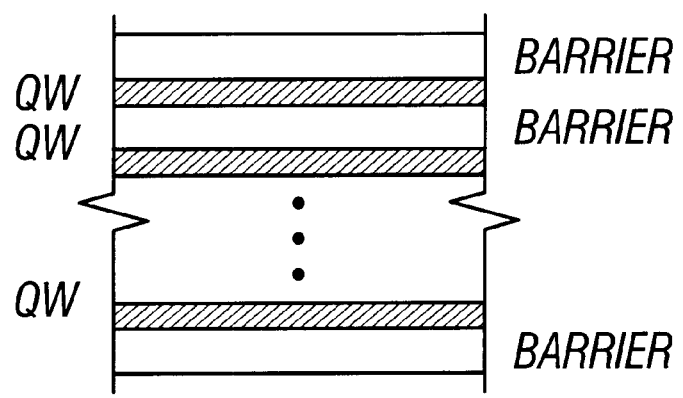
FIG. 10 is a cross-sectional view of an active layer of the present invention that includes quantum wells and barriers.

As illustrated in FIG. 10 each active region 16, 18 and 30 includes a least one quantum well, generally denoted as 48 in FIG. 10. In one embodiment, each active region includes a plurality of quantum wells 48. The quantum wells 48 in each active region 16, 18 and 30 can have different widths, the same widths, different maximum gain wavelengths, the same maximum gain wavelength, different compositions, the same strain and different strain. Quantum wells 48 can be strained quantum wells, tensile strained quantum wells, unstrained quantum wells, compression strained quantum well. All quantum wells 48 can be the same type, different types and combinations.

All or some of the different quantum wells 48 in each active region 16, 18 and 30 can have different widths, generate different maximum gain wavelengths, or generate the same maximum gain wavelengths. In one embodiment, quantum wells 48 in active region 16 generate a first wavelength, those in active region 18 a different wavelength, those in active region 30 yet another wavelength and so on.

Figure 11:
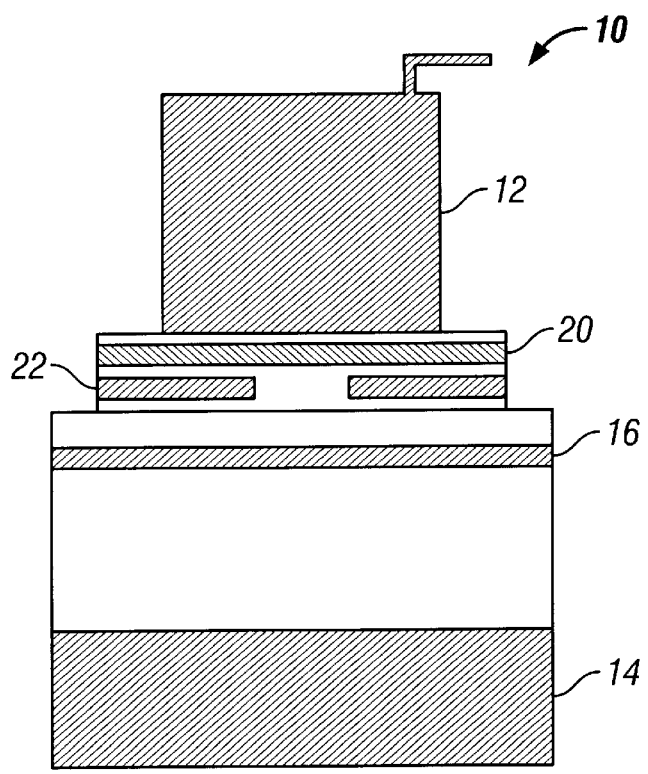
FIG. 11 is a cross-sectional view of a VCSEL structure of the present invention with a tunnel junction positioned between the top mirror and an oxide layer, and the top mirror is an n-doped DBR.

Referring still to FIG. 11, the plurality of quantum wells 48 in each active region 16, 18 and 30 can have a plurality of barriers 50. All or a portion of the plurality of barriers 50 can have the same strain or different strains.

Each active region 16, 18 and 30 can be a bulk region. The use of a bulk region increases the confinement factor and the modal gain. Bulk regions 52 can be non-doped, uniformly doped or non-uniformly doped. Bulk regions 52 have opposing first and second sides 54 and 56 respectively that can be made of the same material or different materials. The thickness of first and second sides 54 and 56 can be the same or different. First and second sides 54 and 56 can have the same doping profiles, different doping profiles and different widths. Each bulk region 52 can be compositionally graded.

Due to the higher mobility of electrons compared to holes, reverse biasing enables the injection of holes through a low resistive n region. This is achieved by using an n doped top mirror 12 or using the structures of FIGS. 11 and 12. The structure illustrated in FIG. 11 includes an n doped top DBR 12 that reduces the resistance of the entire VCSEL 10 structure. In this embodiment, tunnel junction 20 allows the current to be injected with a low access resistance than oxide layer 22 which is located in p-regions.

Figure 12:
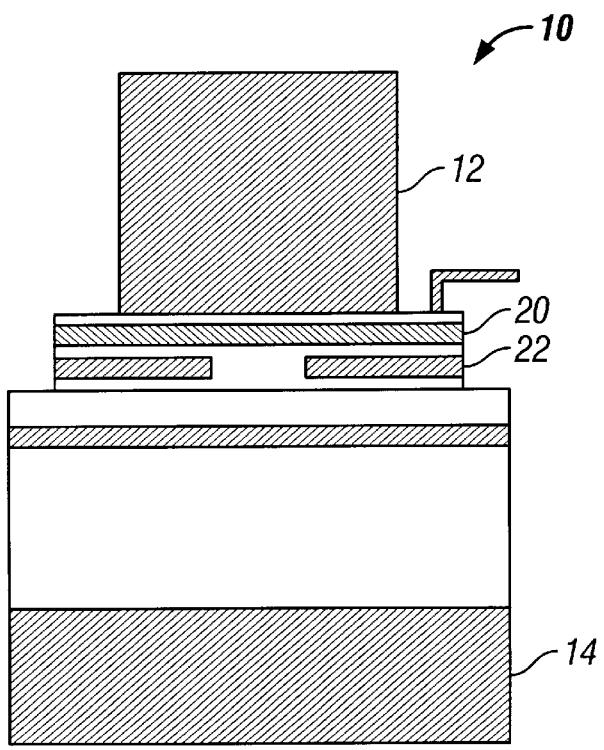
FIG. 12 is a cross-sectional view of a VCSEL structure of the present invention with a tunnel junction positioned between the top mirror and an oxide layer, and the top mirror is an nid DBR.

In FIG. 12 first tunnel junction 20 is positioned between the top mirror 12 and first oxide layer 22 and is either partially doped or undoped The contact taken laterally on top of tunnel junction 20 can therefore flow in the low resistive n-type material before being converted into holes through the reverse biased tunnel junction 20. The current is then funneled through the oxide aperture in layer 22. In the FIG. 11 embodiment, the current is injected through the top DBR 12 while in FIG. 12 embodiment the current is injected laterally. With the FIG. 12 embodiment, lateral injection of current permits the use of a non-doped DBR which greatly reduces the free carrier losses.

Figure 13:
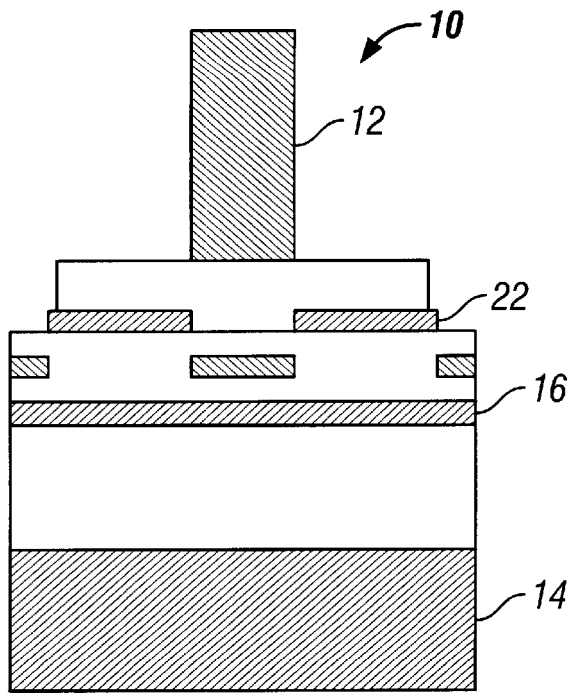
FIG. 13 is a cross-sectional view of a VCSEL structure of the present invention with an oxide layer positioned between the top mirror and the top active layer, and a tunnel junction positioned between the oxide layer and the top active layer.
Figure 14:
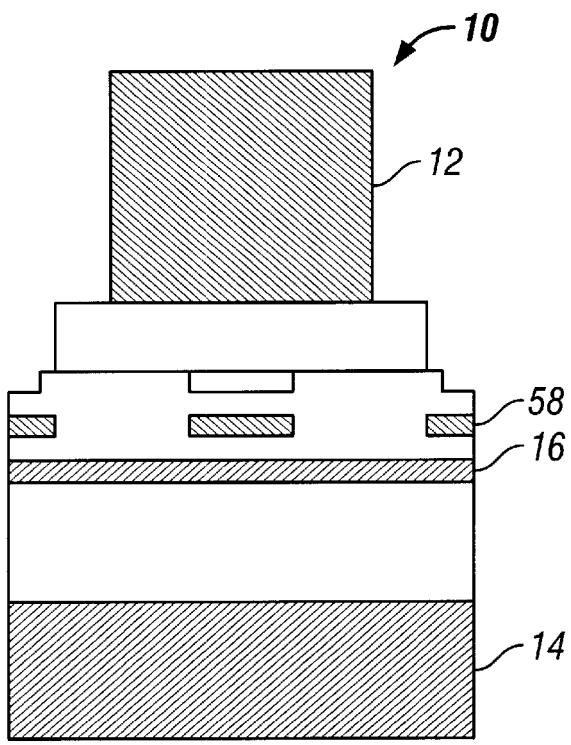
FIG. 14 is a cross-sectional view of a VCSEL structure of the present invention with an ion implantation layer.

In another embodiment, illustrated in FIG. 13, first oxide layer 22 is positioned between top mirror 12 and first tunnel junction 20. In this embodiment, first oxide layer 22 is used for index guiding to allow for single mode stability and tunnel junction 20 function is used for current injection through low optical losses materials. In this embodiment, the current confinement is done through an implantation step, plasma etching or undercutting.

Variations of embodiments illustrated in FIGS. 11, 12 and 13 include use of a double intracavity contact by putting a lateral contact below active region 16 to allow bottom DR 14 to be undoped which reduces the losses due to bottom DBR 14. Additionally, the embodiments illustrated in FIGS. 1 through 14 can also employ the lateral injection of current shown in the FIGS. 11 and 12 embodiments.

Figure 15:
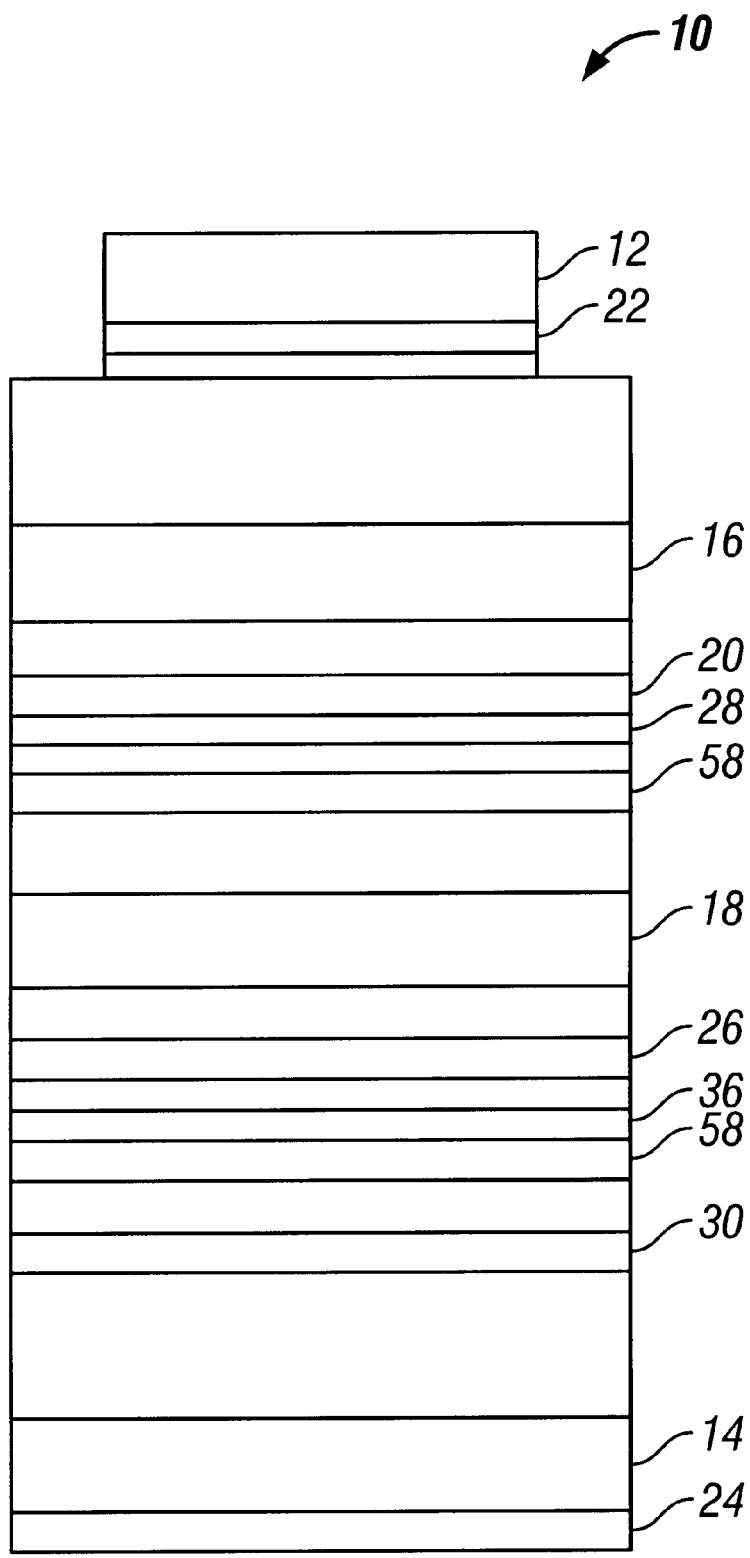
FIG. 15 is a cross-sectional view of a VCSEL structure similar to the VCSEL structure of FIG. 5 with ion implantation layers substituted for the second and third oxide layers.

Top mirror 12 can be an n-doped DBR. In order to benefit from the low access resistance of n-doped DBR 12 an injection through a reverse biased tunnel junction 20 are combined with first oxide layer 22 that induces an index guiding. In another embodiment of the present invention, illustrated in FIG. 14, VCSEL 10 includes first tunnel junction 20 and an ion implantation layer 58, each positioned between top and bottom mirrors 12 and 14. Ion implantation is used to locally destroy the conductive properties which enables the creation of a locally conductive area and provides for current localization. In the embodiment illustrated in FIG. 14, first ion implantation layers 58 is substituted for the oxide layers of the FIGS. 1 through 13 embodiments. Additional ion implantation layers can be included and be positioned between adjacent tunnel junctions and active regions as shown in FIG. 15. First oxide layer 22 can also be included and positioned between top mirror 12 and top active region, or between bottom mirror 14 and the bottom active region (not shown). In the FIG. 15 embodiment, there is an amount of index guiding and current confinement.

In the FIG. 15 embodiment, the layers are grown by standard methods, such as molecular beam epitaxy and the like. After this growth a photoresist mask is deposited above the parts where the implantation needs to be prevented. The structure is then exposed to a high energy ion beam. Ions are implanted to depths which are determined by the ion beam energy.

Figure 16:
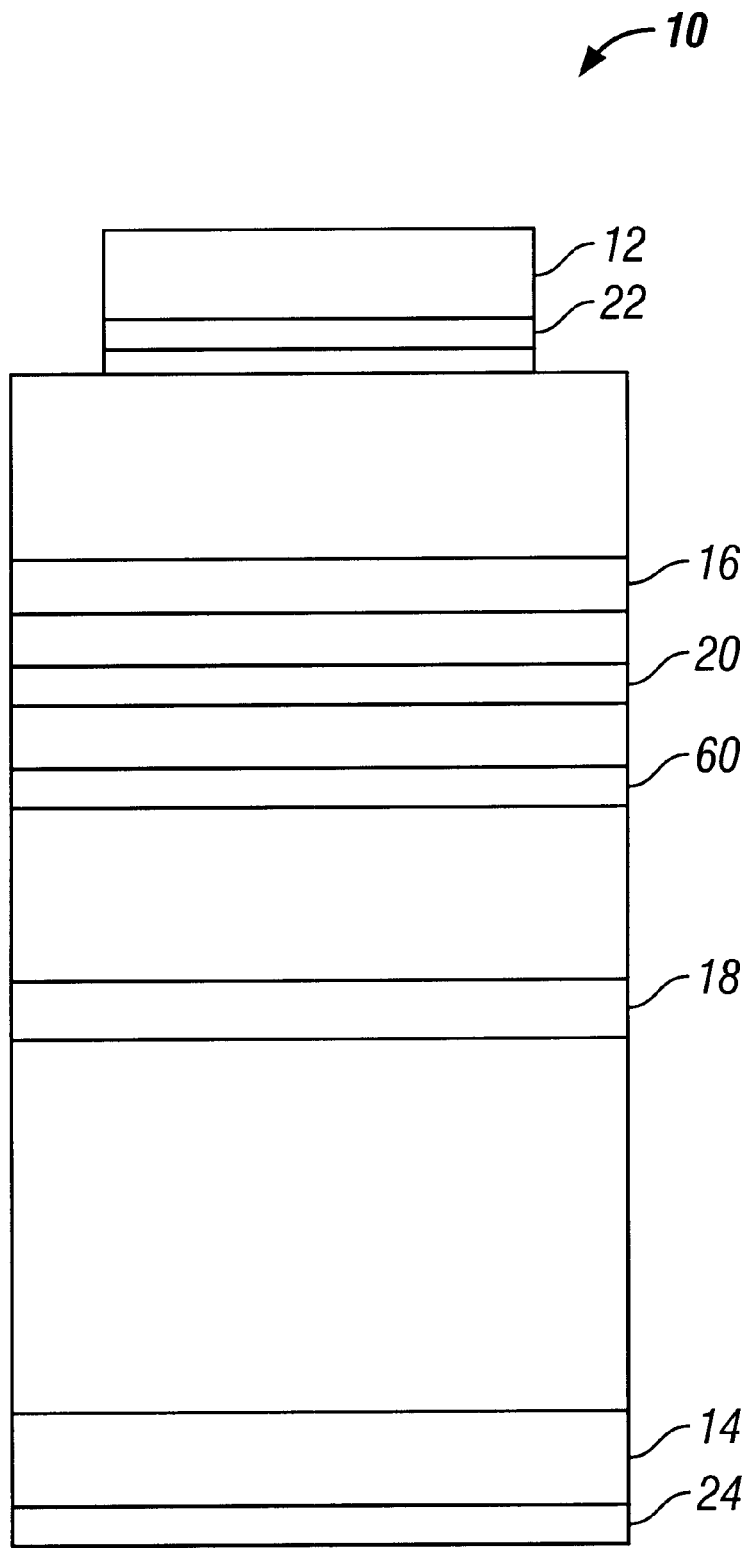
FIG. 16 is a cross-sectional view of a VCSEL structure similar to the VCSEL structure of FIG. 1(a) with the inclusion of an etched layer.
Figure 17:
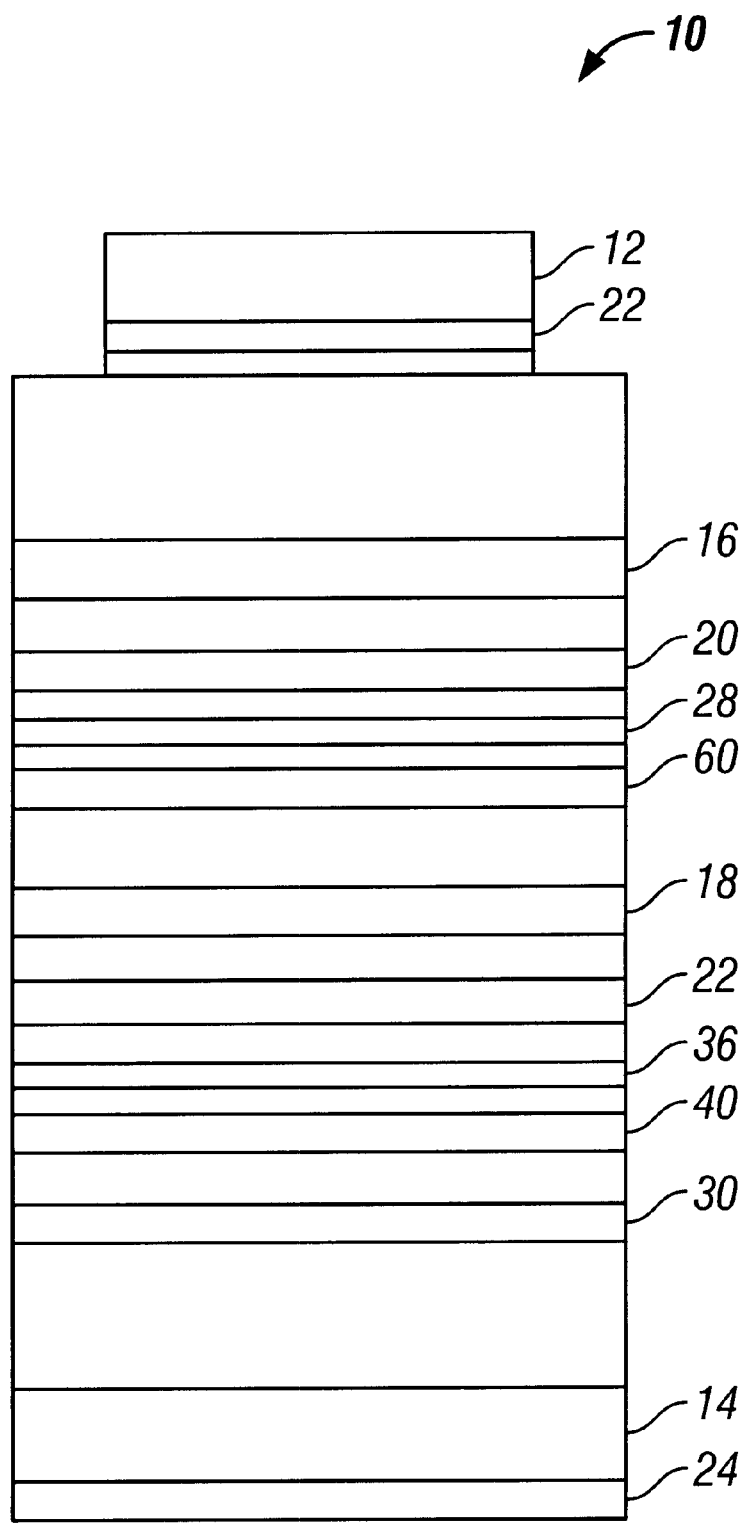
FIG. 17 is a cross-sectional view of a VCSEL structure similar to the VCSEL structure of FIG. 5 with etched layers substituted for the second and third oxide layers.
Figure 18A:
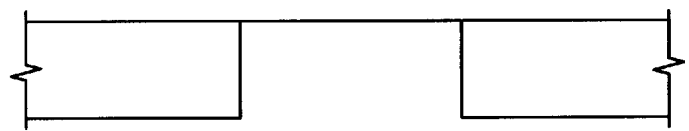
FIG. 18(a) is a cross-sectional view of the etched layer of FIG. 16 with a vertical profile.
Figure 18B:
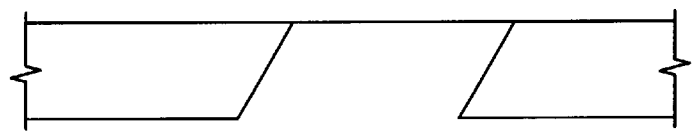
FIG. 18(b) is a cross-sectional view of the etched layer of FIG. 16 with a slopped profile.
Figure 18C:
FIG. 18(c) is a cross-sectional view of the etched layer of FIG. 16 with a variable geometric profile.
Figure 18D:
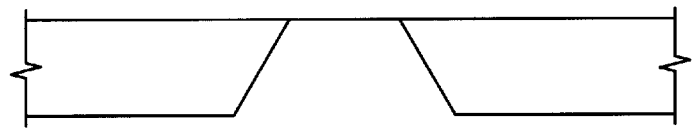
FIG. 18(d) is a cross-sectional view of the etched layer of FIG. 16 with another example of a variable geometric profile.
Figure 18E:
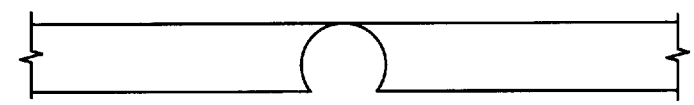
FIG. 18(e) is a cross-sectional view of the etched layer of FIG. 16 with yet another example of a variable geometric profile.

In another embodiment, illustrated in FIG. 16, VCSEL 10 includes first tunnel junction 20 and a first etched layer 60, each positioned between top and bottom mirrors 12 and 14. In the embodiment illustrated in FIG. 16, first etched layer 60 is substituted for the oxide layers of the FIGS. 1 through 13 embodiments. Additional etched layers can be included and be positioned between adjacent tunnel junctions and active regions as shown in FIG. 17. Etching provides formation of current localization because etched portions are electrical insulators.

Each etched layer 60 can have a variety of different profiles. As illustrated in FIGS. 18(a), 18(b), 18(c) through 18(e), etched layer 60 can have with respect to a longitudinal axis of substrate 24, a vertical profile, a slopped profile, a variable geometric profile and an undercut profile.

One or both of top mirror 12 and bottom mirror 14 can be a lattice relaxed mirror. First tunnel junction 20 is positioned between top and bottom mirrors 12 and 14. Additionally, first oxide layer 22 can be positioned adjacent to top mirror 12 or bottom mirror 14. With any of the embodiments illustrated in FIGS. 1 through 17 top and bottom mirrors 12 and 14 can be lattice relaxed mirrors. Lattice relaxed mirrors permit the use of materials with high index contrast, high reflectivities, and low thermal resistively without the constraint of lattice matching.

In this embodiment, substrate 24 can be made of a lattice defining material such as InP, GaAs and the like. A stack of layers on top of substrate 24 forms bottom mirror 14 and can consists of a combination of material such as InAlGaAs/InAlAs, InGaAsP/InP, AlGaAsSb/AlAsSb, InGaN, GaN, AlGaInAsN/GaAs and the like. Bottom mirror 14 can be formed of alternating layers of InAlGaAs and InAlAs. The refractive index is different between the layers. The number of the alternating layers can be, for example, from 2–2000 in order to achieve the desired reflectivity.

Bottom mirror 14 can be lattice matched to the lattice defining material of substrate 24. Bottom 14 can be grown using any epitaxial growth method, such as metal-organic chemical vapor deposition (MOCVD), molecular beam epitaxy (MBE) e-beam, chemical beam epitaxy, and the like.

A spacer layer, not shown, can be deposited on top of bottom mirror 14. The material of spacer layer can be made of InAlGaAs/InAlAs, InGaAsP/InP, AlGaAsSb/AlAsSb, InGaN, GaN, AlGaInAsN/GaAs and the like. The spacer layer can be lattice matched to the lattice defining material of substrate 24.

Top mirror 12 can also be a DBR that is grown on top of a confinement layer that can also be considered as part of top mirror 12. The confinement layer and top mirror 12 can be the lattice relaxed portion of VCSEL 10. The lattice mismatch factor may be 0–500%, from the lattice defining material.

Top mirror 12 is made of a material such as AlGaAs, InGaP, InGaAsP and the like. In one embodiment, top mirror 12 is made of a set of alternating layers of AlGaAs and GaAs. The high Al-content AlGaAs layers are the low refractive index layers.

In another embodiment, one or both of top mirror 12 and bottom mirror 14 can be a dielectric mirror. First tunnel junction 20 is positioned between top and bottom mirror 12 and 14. First oxide layer 22 can be positioned adjacent to top mirror 12 or bottom mirror 14. With any of the embodiments illustrated in FIGS. 1 through 17 top and bottom mirrors 12 and 14 can be dielectric mirrors. Dielectric materials exhibit large index contrast. Therefore a fewer number of pairs is necessary to obtain high reflectivities.

Referring now to FIG. 19, one or both of mirrors 12 and 14 can be a fiber 62 with a grating 64. Suitable fibers 62 include but are not limited to single or multi-mode filters, silicon, plastic and the like. First tunnel junction 20 is positioned between top and bottom mirrors 12 and 14. First oxide layer 22 can be positioned adjacent to top mirror 12 or bottom mirror 14. With any of the embodiments illustrated in FIGS. 1 through 17 top and bottom mirrors 12 and 14 can be a fiber 62 with grating 64. Grating 64 can be used to form an external cavity which allows for wavelength tuning by moving fiber 62. Grating 64 also eliminates the need for DBR's and therefore reduces manufacturing time and costs.

In another embodiment, illustrated in FIG. 20, one or both of top and bottom mirrors 12 and 14 is a fused mirror 65. Wafer fusion has the same advantages as growth of lattice relaxed mirror except that in the wafer fusion case no threading dislocations are present in the mirror. The use of wafer fusion permits the use of a material system for the DBR that is mismatched from the substrate.

First tunnel junction 20 is positioned between top and bottom mirrors 12 and 14. First oxide layer 22 can be positioned adjacent to top mirror 12 or bottom mirror 14. With any of the embodiments illustrated in FIGS. 1 through 17 top and bottom mirrors 12 and 14 can be fused mirrors.

As illustrated in FIG. 21, top mirror 12 of any of the FIGS. 1 through 20 can be a cantilever apparatus that uses an electrostatic force that pulls on a cantilever arm. The mechanical deflection resulting from this electrostatic force is used to change the length of a Fabry-Perot microcavity and consequently to the resonance wavelength.

In this embodiment, top mirror 12 has a cantilever structure consisting of a base 66, an arm 68 and an active head 70. The bulk of cantilever structure may consist of a plurality of reflective layers 72 which form a distributed Bragg reflector (DBR). Layers 72 can be formed of different materials including but not limited to AlGaAs. Different compositional ratios are used for individual layers 72, e.g., $Al_{0.09}Ga_{0.91}As/Al_{0.58}Ga_{0.42}As$. The topmost layer of layers 72 is heavily doped to ensure good contact with an electrical tuning contact 74 deposited on top of the cantilever structure.

The actual number of layers 72 may vary from 1 to 20 and more, depending on the desired reflectivity of the DBR. Furthermore, any suitable reflecting material other than AlGaAs may be used to produce layers 72. Active head 70 is made of layers. However, arm 68 and base 66 do not need to be made of layers.

Base 66 can have a variety of different geometric configurations and large enough to maintain dimensional stability of the cantilever structure. The width of arm 68 ranges typically from 2 to 8 microns while its length is 25 to 100 mu m or more. The stiffness of arm 68 increases as its length decreases. Consequently, shorter cantilevers require greater forces to achieve bending but shorter cantilevers also resonate at a higher frequency. The preferred diameter of active head 70 falls between 5 and 40 microns. Other dimensions are suitable.

Electrical tuning contact 74 resides on all or only a portion of a top of the cantilever structure. Electrical tuning contact 74 be sufficiently large to allow application of a first tuning voltage $V_{t1}$. A support 76 rests on a substrate 78 across which a voltage can be sustained. Substrate 78 can include a second DBR 68. Support 76 can be made of the same material as layers 72. A voltage difference between layers 72 and substrate 78 causes a deflection of arm 68 towards substrate 78. If layers 72 and substrate 78 are oppositely doped, then a reverse bias voltage can be established between them. Substrate 78 is sufficiently thick to provide mechanical stability to the entire cantilever apparatus. Inside substrate 78 and directly under active head 70 are one or more sets of reflective layers with each set forming a second DBR. A more complete description of the cantilever apparatus is disclosed in U.S. Pat. No. 5,629,951, incorporated herein by reference.

The foregoing description of a preferred embodiment of the invention has been presented for purposes of illustration and description. It is not intended to be exhaustive or to limit the invention to the precise forms disclosed. Obviously, many modifications and variations will be apparent to practitioners skilled in this art. It is intended that the scope of the invention be defined by the following claims and their equivalents.

What is claimed is:

1. A vertical cavity apparatus, comprising:
   a first mirror;
   a substrate;
   a second mirror coupled to the substrate;
   at least a first and a second active region each positioned between the first and second mirrors, each of the first and second active regions being made of a material that upon application of electrical or electromagnetic energy the first and second regions become optically active;
   a first ion implantation layer positioned between the first and second mirrors; and
   a first tunnel junction positioned between the first and second mirrors.

2. The apparatus of claim 1, further comprising:
   at least a first oxide layer positioned between the first and second mirrors.

3. The apparatus of claim 2, wherein the first oxide layer is positioned between the first mirror and the first active region.

4. The apparatus of claim 2, wherein the first oxide layer is positioned between the second mirror and the second active region.

5. The apparatus of claim 1, wherein the first tunnel junction is positioned between the first and second active regions.

6. The apparatus of claim 1, wherein the substrate has a given crystallographic orientation.

7. The apparatus of claim 1, wherein the first mirror includes a metallic layer.

8. The apparatus of claim 1, wherein the substrate has a etched pattern formed on a top or a bottom surface.

9. The apparatus of claim 1, wherein the substrate includes an epitaxy structure.

10. The apparatus of claim 1, wherein the substrate includes a dielectric pattern for selective area epitaxy.

11. The apparatus of claim 1, wherein substantially the entire apparatus is grown on a planar substrate with at least one layer grown while the planar substrate is held stationary and the other layers are grown while the planar substrate is rotated.

12. The apparatus of claim 1, wherein the first mirror is tunable.

13. The apparatus of claim 1, wherein the first mirror includes a tunable filter.

14. The apparatus of claim 1, further comprising:
    a tunable filter coupled to the first mirror.

15. The apparatus of claim 1, wherein the tunnel junction has first and second opposing sides that are made of the same material.

16. The apparatus of claim 1, wherein the tunnel junction has first and second opposing sides that are made of different materials.

17. The apparatus of claim 1, wherein the tunnel junction has first and second opposing sides each having a different thickness.

18. The apparatus of claim 1, wherein the tunnel junction has first and second opposing sides each having a different doping profile.

19. The apparatus of claim 1, wherein the tunnel junction is substantially uniformly doped.

20. The apparatus of claim 1, wherein the tunnel junction is non-uniformly doped.

21. The apparatus of claim 1, wherein the tunnel junction is a compositionally graded tunnel junction.

22. The apparatus of claim 1, wherein the first active region includes a first quantum well.

23. The apparatus of claim 1, wherein the first active region includes a plurality of first quantum wells.

24. The apparatus of claim 23, wherein at least a portion of the plurality of first quantum wells have different widths.

25. The apparatus of claim 23, wherein at least a portion of the plurality of first quantum wells have the same widths.

26. The apparatus of claim 23, wherein at least a portion of the plurality of first quantum wells have different maximum gain wavelength.

27. The apparatus of claim 23, wherein at least a portion of the plurality of first quantum wells have the same maximum gain wavelength.

28. The apparatus of claim 23, wherein at least a portion of individual quantum wells of the plurality of first quantum wells have different compositions.

29. The apparatus of claim 23, wherein at least a portion of individual quantum wells of the plurality of first quantum wells have the same composition.

30. The apparatus of claim 23, wherein at least a portion of individual quantum wells of the plurality of first quantum wells have the same strain.

31. The apparatus of claim 23, wherein at least a portion of individual quantum wells of the plurality of first quantum wells have different strain.

32. The apparatus of claim 23, wherein the plurality of first quantum wells has a plurality of barriers and at least a portion of barriers in the plurality have the same strain.

33. The apparatus of claim 23, wherein the plurality of first quantum wells has a plurality of barriers and at least a portion of barriers in the plurality have different strains.

34. The apparatus of claim 23, wherein the plurality of first quantum wells has a plurality of barriers and at least a portion of barriers in the plurality are unstrained.

35. The apparatus of claim 23, wherein the second active region includes a second quantum well.

36. The apparatus of claim 35, wherein the second active region includes a plurality of second quantum wells.

37. The apparatus of claim 36, wherein at least a portion of the plurality of second quantum wells have different widths.

38. The apparatus of claim 36, wherein at least a portion of the plurality of second quantum wells have the same widths.

39. The apparatus of claim 36, wherein at least a portion of the plurality of second quantum wells have different maximum gain wavelength.

40. The apparatus of claim 36, wherein at least a portion of the plurality of second quantum wells have the same maximum gain wavelength.

41. The apparatus of claim 36, wherein at least a portion of individual quantum wells of the plurality of second quantum wells have different compositions.

42. The apparatus of claim 36, wherein at least a portion of individual quantum wells of the plurality of second quantum wells have the same composition.

43. The apparatus of claim 36, wherein at least a portion of individual quantum wells of the plurality of second quantum wells have the same strain.

44. The apparatus of claim 36, wherein at least a portion of individual quantum wells of the plurality of second quantum wells have different strain.

45. The apparatus of claim 36, wherein the plurality of second quantum wells has a plurality of barriers and at least a portion of barriers in the plurality have the same strain.

46. The apparatus of claim 36, wherein the plurality of second quantum wells has a plurality of barriers and at least a portion of barriers in the plurality have different strains.

47. The apparatus of claim 35, wherein each of the first and second quantum wells is selected from a strained quantum well, a tensile strained quantum well, an unstrained quantum well and a compression strained quantum well.

48. The apparatus of claim 35, wherein a width of the first quantum well is different from a width of the second quantum well.

49. The apparatus of claim 35, wherein the first quantum well generates a first quantum well maximum gain wavelength, and the second quantum well generates a second quantum well maximum gain wavelength.

50. The apparatus of claim 49, wherein the first and second quantum well maximum gain wavelengths are different.

51. The apparatus of claim 49, wherein the first and second quantum well maximum gain wavelengths are the same.

52. The apparatus of claim 49, wherein the first quantum well maximum gain wavelength is longer than the second quantum well maximum gain wavelength.

53. The apparatus of claim 1, wherein the first active region includes a first bulk region.

54. The apparatus of claim 53, wherein the second active region includes a second bulk region.

55. The apparatus of claim 53, wherein at least one of the first and second bulk regions is non-doped.

56. The apparatus of claim 53, wherein at least one of the first and second bulk regions is substantially uniformly doped.

57. The apparatus of claim 53, wherein at least one of the first and second bulk regions is non-uniformly doped.

58. The apparatus of claim 53, wherein at least one of the first and second bulk regions has first and second opposing sides that are made of the same material.

59. The apparatus of claim 53, wherein at least one of the first and second bulk regions has first and second opposing sides that are made of different materials.

60. The apparatus of claim 54, wherein at least one of the first and second bulk regions has first and second opposing sides each having a different thickness.

61. The apparatus of claim 54, wherein at least one of the first and second bulk regions has first and second opposing sides each having a different doping profile.

62. The apparatus of claim 54, wherein at least one of the first and second bulk regions is compositionally graded.

63. The apparatus of claim 54, wherein a width of the first bulk region is different from a width of the second bulk region.

64. The apparatus of claim 35, further comprising:
a first partial DBR positioned between the first and second active regions.

65. The apparatus of claim 1, wherein the first and second mirrors are each DBRs.

66. The apparatus of claim 35, further comprising:
a third active region positioned between the second active region and the second mirror.

67. The apparatus of claim 66, wherein the third active region includes a third quantum well.

68. The apparatus of claim 67, wherein the third active region includes a plurality of third quantum wells.

69. The apparatus of claim 68, wherein at least a portion of the plurality of third quantum wells have different widths.

70. The apparatus of claim 68, wherein at least a portion of the plurality of third quantum wells have the same widths.

71. The apparatus of claim 68, wherein at least a portion of the plurality of third quantum wells have different maximum gain wavelength.

72. The apparatus of claim 68, wherein at least a portion of the plurality of third quantum wells have the same maximum gain wavelength.

73. The apparatus of claim 68, wherein at least a portion of individual quantum wells of the plurality of third quantum wells have different compositions.

74. The apparatus of claim 68, wherein at least a portion of individual quantum wells of the plurality of third quantum wells have the same composition.

75. The apparatus of claim 68, wherein at least a portion of individual quantum wells of the plurality of third quantum wells have the same strain.

76. The apparatus of claim 68, wherein at least a portion of individual quantum wells of the plurality of third quantum wells have different strain.

77. The apparatus of claim 68, wherein the plurality of third quantum wells has a plurality of barriers and at least a portion of barriers in the plurality have the same strain.

78. The apparatus of claim 68, wherein the plurality of third quantum wells has a plurality of barriers and at least a portion of barriers in the plurality have different strains.

79. The apparatus of claim 67, wherein the third active region includes a third bulk region.

80. The apparatus of claim 79, wherein each of the first, second and third bulk regions has a different width.

81. The apparatus of claim 78, wherein the first quantum well generates a first quantum well maximum gain wavelength, the second quantum well generates a second quantum well maximum gain wavelength and the third quantum well generates a third quantum well maximum gain wavelength.

82. The apparatus of claim 78, wherein all of the first, second and third quantum well maximum gain wavelengths are all different.

83. The apparatus of claim 78, wherein at least two of the first, second and third quantum well maximum gain wavelengths are different.

84. The apparatus of claim 78, wherein all of the first, second and third quantum well maximum gain wavelengths are the same.

85. The apparatus of claim 78, wherein at least two of the first, second and third quantum well maximum gain wavelengths are the same.

86. The apparatus of claim 78, wherein each of the first, second and third quantum wells has a different width.

87. The apparatus of claim 78, wherein each of the first, second and third quantum wells produces an output with a different wavelength.

88. The apparatus of claim 78, further comprising:
   a second tunnel junction positioned between the second active region and the third active region.

89. The apparatus of claim 88, wherein the second tunnel junction has first and second opposing sides that are made of the same material.

90. The apparatus of claim 88, wherein the second tunnel junction has first and second opposing sides that are made of the different materials.

91. The apparatus of claim 88, wherein the second tunnel junction has first and second opposing sides each having a different thickness.

92. The apparatus of claim 88, wherein the second tunnel junction has first and second opposing sides each having a different doping profile.

93. The apparatus of claim 88, wherein the second tunnel junction is a compositionally graded tunnel junction.

94. The apparatus of claim 87, further comprising:
   a first partial DBR positioned between the first tunnel junction and the second active region; and
   a second partial DBR positioned between the second tunnel junction and the third active region.

95. The apparatus of claim 88, further comprising:
   a second ion implantation layer positioned between the first tunnel junction and the second active region; and
   a third ion implantation layer positioned between the second tunnel junction and the third active region.

96. The apparatus of claim 95, further comprising:
   a first partial DBR positioned between the first tunnel junction and the second ion implantation layer; and
   a second partial DBR positioned between the second tunnel junction and the third ion implantation layer.

97. A vertical cavity surface emitting laser, comprising:
   a first mirror;
   a substrate;
   a second mirror coupled to the substrate;
   at least a first and a second active region each positioned between the first and second mirrors, each of the first and second active regions being made of a material that upon application of electrical or electromagnetic energy the first and second regions become optically active;
   a first ion implantation layer positioned between the first and second mirrors; and
   a first tunnel junction positioned between the first and second mirrors.

98. A detector, comprising:
   a first mirror;
   a substrate;
   a second mirror coupled to the substrate;
   at least a first and a second active region each positioned between the first and second mirrors, each of the first and second active regions being made of a material that upon application of electrical or electromagnetic energy the first and second regions become optically active;
   a first ion implantation layer positioned between the first and second mirrors; and
   a first tunnel junction positioned between the first and second mirrors.

99. A modulator, comprising:
   a first mirror;
   a substrate;
   a second mirror coupled to the substrate;
   at least a first and a second active region each positioned between the first and second mirrors, each of the first and second active regions being made of a material that upon application of electrical or electromagnetic energy the first and second regions become optically active;
   a first ion implantation layer positioned between the first and second mirrors; and
   a first tunnel junction positioned between the first and second mirrors.

100. An actuator, comprising:
   a first mirror;
   a substrate;
   a second mirror coupled to the substrate;
   at least a first and a second active region each positioned between the first and second mirrors, each of the first and second active regions being made of a material that upon application of electrical or electromagnetic energy the first and second regions become optically active;
   a first ion implantation layer positioned between the first and second mirrors; and
   a first tunnel junction positioned between the first and second mirrors.

101. An amplifier, comprising:
   a first mirror;
   a substrate;
   a second mirror coupled to the substrate;
   at least a first and a second active region each positioned between the first and second mirrors, each of the first and second active regions being made of a material that upon application of electrical or electromagnetic energy the first and second regions become optically active;
   a first ion implantation layer positioned between the first and second mirrors; and
   a first tunnel junction positioned between the first and second mirrors.

* * * * *